(12) United States Patent
David

(10) Patent No.: US 9,378,782 B1
(45) Date of Patent: Jun. 28, 2016

(54) APPARATUS WITH WRITE-BACK BUFFER AND ASSOCIATED METHODS

(71) Applicant: Silicon Laboratories Inc., Austin, TX (US)

(72) Inventor: Thomas Saroshan David, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 14/720,811

(22) Filed: May 24, 2015

(51) Int. Cl.
*G11C 7/10* (2006.01)

(52) U.S. Cl.
CPC .................................... *G11C 7/10* (2013.01)

(58) Field of Classification Search
CPC .... G11C 7/1051; G11C 7/1057; G11C 16/06; G11C 5/06
See application file for complete search history.

(56) References Cited

U.S. PATENT DOCUMENTS

| 4,376,974 A * | 3/1983 | Stewart | G06F 17/30982 707/E17.04 |
|---|---|---|---|
| 2006/0158214 A1* | 7/2006 | Janzen | G11C 7/1051 326/30 |
| 2013/0304966 A1* | 11/2013 | Joo | G06F 12/0246 711/103 |
| 2014/0192583 A1* | 7/2014 | Rajan | G11C 7/10 365/63 |
| 2015/0193302 A1* | 7/2015 | Hyun | G11C 29/52 714/764 |

* cited by examiner

*Primary Examiner* — Tuan T Nguyen
(74) *Attorney, Agent, or Firm* — Law Offices of Maximilian R. Peterson

(57) ABSTRACT

An apparatus comprises a source to communicate data, and a storage circuit to store data communicated by the source. The apparatus further comprises a write-back buffer to store data communicated by the source in a misaligned write operation in order to improve throughput between the source and the storage circuit.

20 Claims, 5 Drawing Sheets

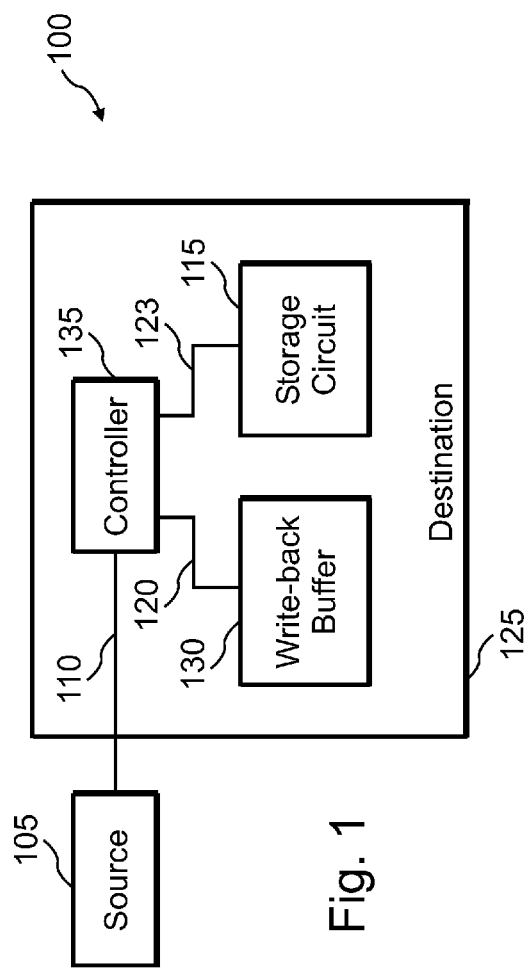
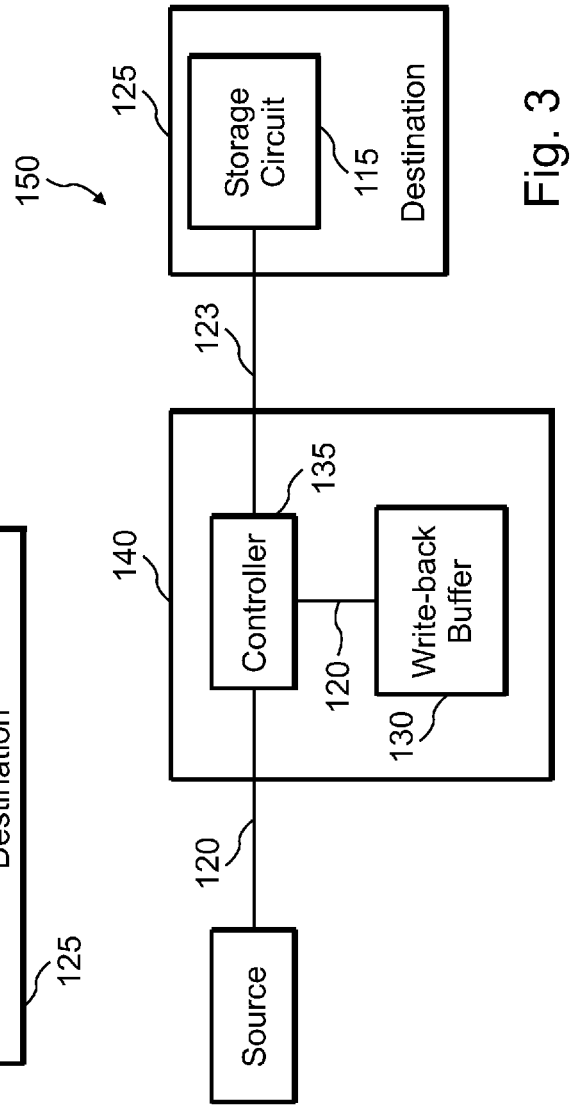

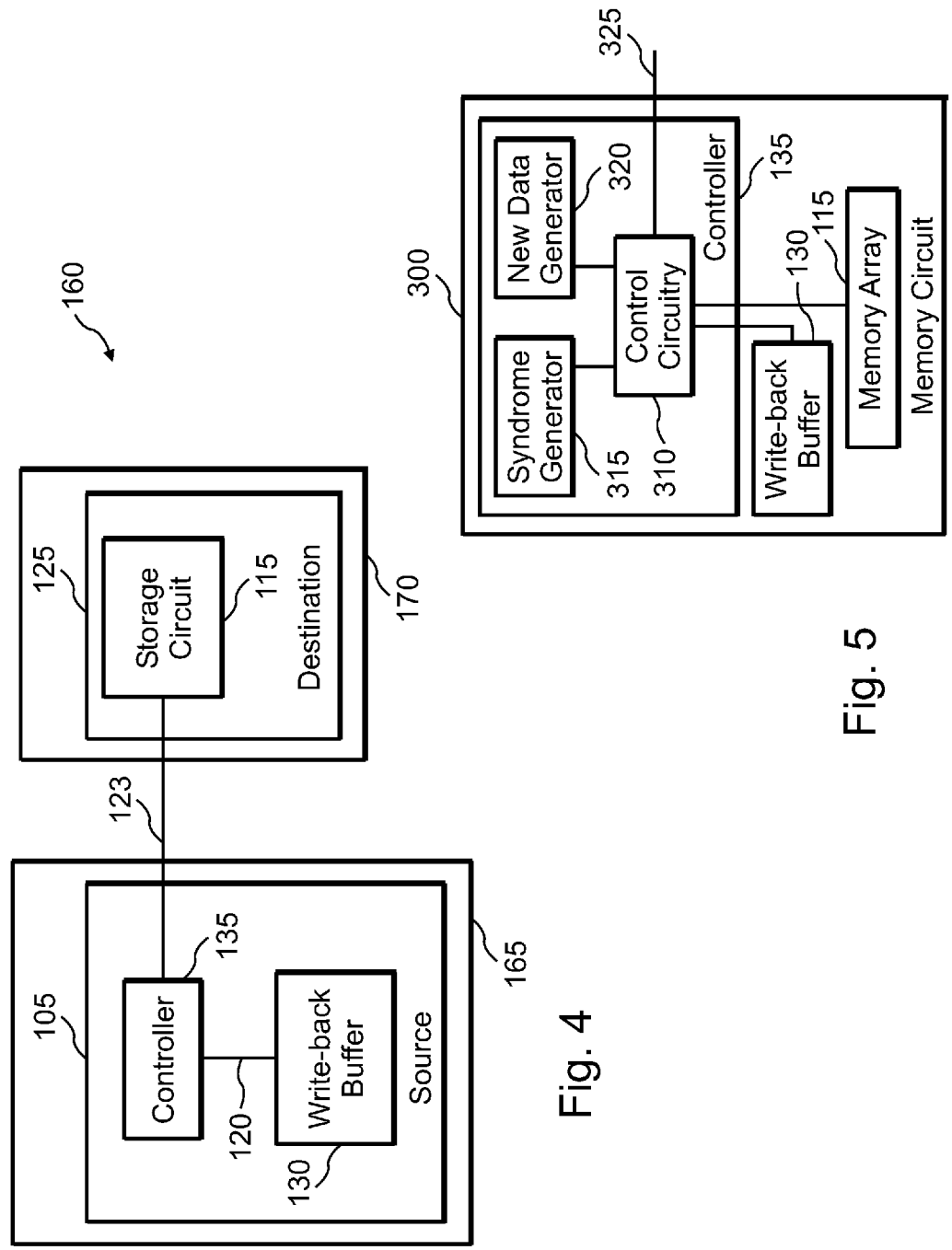

US 9,378,782 B1

APPARATUS WITH WRITE-BACK BUFFER AND ASSOCIATED METHODS

TECHNICAL FIELD

The disclosure relates generally to electronic apparatus with improved throughput or performance and, more particularly, to electronic apparatus using a write-back buffer to improve performance, and associated methods.

BACKGROUND

Electronic apparatus such as memories (e.g., random-access memory (RAM)) typically access data in chunks or collections, such as words (e.g., a 32-bit word). Some memories store the data together with error-correction code (ECC) data or information. The ECC data are calculated based on the data in a given word, and are written to the memory together with the respective word. During a read operation, the ECC data are read as well as the respective word. The ECC data allows detection and/or correction of some errors, for example, an incorrect bit or more than one incorrect bits.

The description in this section and any corresponding figure(s) are included as background information materials. The materials in this section should not be considered as an admission that such materials constitute prior art to the present patent application.

SUMMARY

A variety of apparatus including a write-back buffer to improve throughput and corresponding methods are contemplated. According to one exemplary embodiment, an apparatus comprises a source to communicate data, and a storage circuit to store data communicated by the source. The apparatus further comprises a write-back buffer to store data communicated by the source in a misaligned write operation in order to improve throughput between the source and the storage circuit.

According to another exemplary embodiment, an apparatus includes a memory circuit. The memory circuit includes a controller coupled via a link to receive data from a source external to the memory circuit and to provide data to the source external to the memory circuit. The memory circuit further includes a storage circuit to store data in a write operation and to provide data in a read operation. The memory circuit also includes a write-back buffer coupled to store data in the write operation and to provide data in the read operation so as to improve misaligned write data throughput between the memory circuit and the source external to the memory circuit.

According to another exemplary embodiment, a method of writing misaligned data includes receiving data from a source during a misaligned write operation, and storing the data received from the source in a storage circuit. The method further includes storing the data received from the source in a write-back buffer to improve throughput between the source and the storage circuit.

BRIEF DESCRIPTION OF THE DRAWINGS

The appended drawings illustrate only exemplary embodiments and therefore should not be considered as limiting the scope of the application or the claims. Persons of ordinary skill in the art appreciate that the disclosed concepts lend themselves to other equally effective embodiments. In the drawings, the same numeral designators used in more than one drawing denote the same, similar, or equivalent functionality, components, or blocks.

FIG. 1 illustrates a circuit arrangement for storing information using a write-back buffer according to an exemplary embodiment.

FIG. 3 depicts a circuit arrangement for storing information using a write-back buffer according to another exemplary embodiment.

FIG. 4 shows a circuit arrangement for storing information using a write-back buffer according to another exemplary embodiment.

FIG. 5 illustrates a circuit arrangement for a memory circuit that uses a write-back buffer according to an exemplary embodiment.

DETAILED DESCRIPTION

Figure 2:
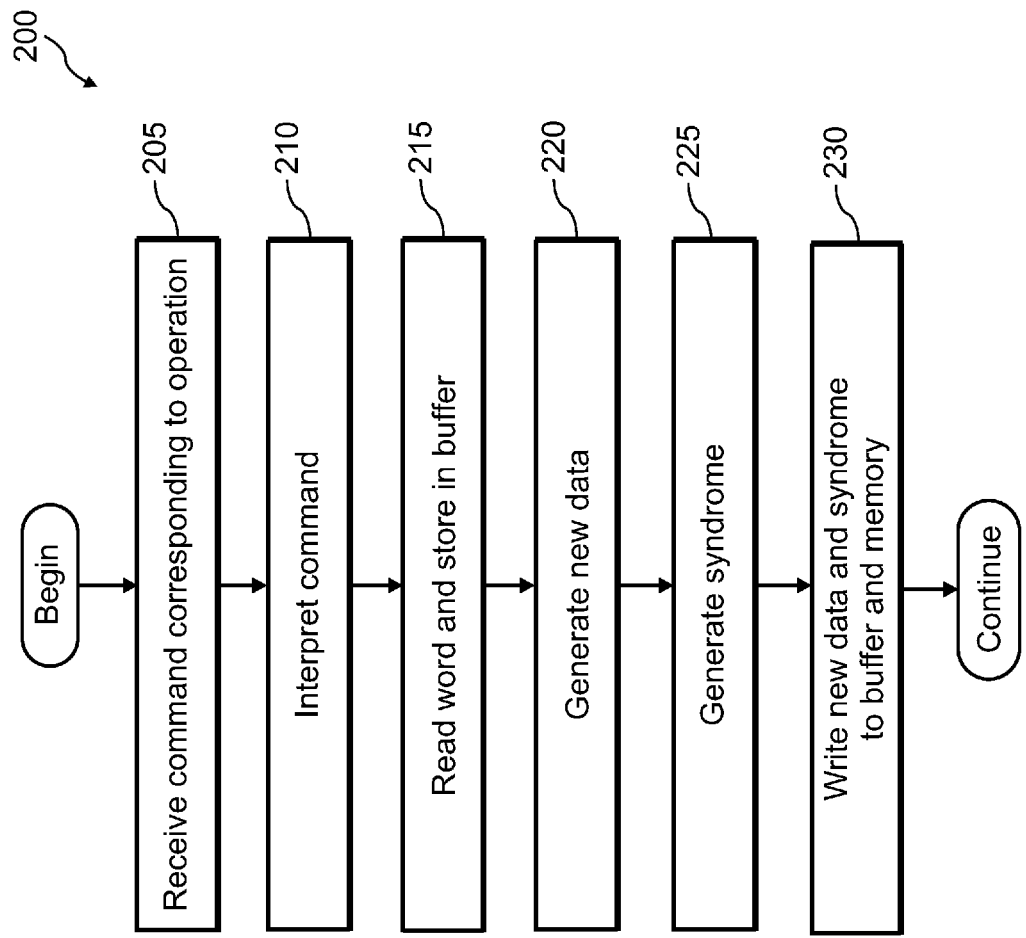
FIG. 2 depicts a process-flow diagram for a method of storing information using a write-back buffer according to an exemplary embodiment.

The disclosed concepts relate generally to electronic apparatus using write-back buffers. More specifically, the disclosed concepts provide apparatus and methods for using write-back buffers to improve throughput in electronic devices, such as data communication with memories (e.g., RAM, flash, and the like).

FIG. 1 illustrates a circuit arrangement 100 for storing information using a write-back buffer according to an exemplary embodiment. Circuit arrangement includes source 105 and destination 125.

Source 105 constitutes a source of data (generally, information). For example, in various embodiments, source 105 may constitute a source of digital information, such as processors, input/output (I/O) devices, peripherals, analog-to-digital converters (ADCs), and the like.

Source 105 provides the data to be written or provided to destination 125. More specifically, source 105 provides the data via link 110. In exemplary embodiments, link 110 may constitute a coupling mechanism, such as a bus, a set of conductors or semiconductors for carrying data, and the like.

In the embodiment shown, destination 125 includes controller 135, write-back buffer 130, and storage circuit 115. Controller 135 facilitates communication between source 105 and destination 125. More specifically, controller 135 receives data from source 105, and handles communication with write-back buffer 130 and storage circuit 115.

In exemplary embodiments, controller 135 uses link 120 (a coupling mechanism, such as a bus, a set of conductors or semiconductors for carrying data, and the like, similar to link 110) to communicate with destination write-back buffer 125. Similarly, controller 135 uses link 123 (a coupling mechanism, such as a bus, a set of conductors or semiconductors for carrying data, and the like, similar to link 110) to communicate with storage circuit 115.

Using link 120, controller 135 provides data to write-back buffer 130, and receives data from write-back buffer 130. In addition, controller 135 may use link 120 to communicate status and/or control signals with write-back buffer 130.

Similarly, using link 123, controller 135 provides data to storage circuit 115, and receives data from storage circuit 115. In addition, controller 135 may use link 123 to communicate status and/or control signals with storage circuit 115.

Destination 125 receives data from source 105, as described above, and stores the data in storage circuit 115. More specifically, destination 125 uses controller 135 to facilitate communication with source 105 to receive data. Once the data are received, controller 135 stores the data in storage circuit 115 (e.g., a memory, or other storage or receiver or destination circuit, such as a transducer, digital-to-analog converter (DAC), peripheral, etc.).

The particular circuitry used in storage circuit 115 depends on the specifications for a given application, as person of ordinary skill in the art will understand. As noted above, in some embodiments, storage circuit 115 constitutes a memory.

In such embodiments, the memory provides a mechanism for storing information received from source 105, i.e., a write operation. The memory also provides a mechanism for retrieving information and providing the information to source 105 (or other source or circuit), i.e., a read operation. The memory may include one or more banks, as desired.

In some embodiments, the memory may include a controller or control circuitry. The controller provides a mechanism for communicating with source 105 and/or other circuitry in destination 125. For example, the controller may receive data for a write operation and provide data for a read operation. Thus, the controller may include circuitry such as address decoders, buffers, and the like, as person of ordinary skill in the art will understand.

The controller may also provide a mechanism or protocol for communication with source 105 and/or other circuitry, such as circuitry in destination 125. Thus, the controller may allow the memory to meet desired protocols, timing conventions, specifications (e.g., throughput), and the like, as person of ordinary skill in the art will understand.

In exemplary embodiments, a variety of types of memory may be used. Generally, the memory may fall into the categories of volatile memory and non-volatile (NV) memory. Examples of volatile memory include RAM, such as dynamic RAM (DRAM), static RAM (SRAM), etc., as person of ordinary skill in the art will understand. Examples of non-volatile memory include flash memory, etc., as person of ordinary skill in the art will understand.

Typically, the data are provided to destination 125 and, ultimately, to storage circuit 115, in chunks or collection of bits. For example, the data may be provided as a set of words. The words may have a variety of lengths or configurations, such as bytes, or a generally a collection of bits, such as 16 bits, 32 bits, etc.

Storage circuit 115, or generally destination 125, in exemplary embodiments can accommodate one or more operations. For example, in some embodiments, storage circuit 115 can store the data, i.e., support a write operation. As another example, in some embodiments, storage circuit 115 can both store the data and also provide the data to another device, block, or circuit (not shown). In other words, storage circuit 115 can support both write and read operations.

In some embodiments, destination 125 uses controller 135 to facilitate the read and/or write operations. In some embodiments, storage circuit 115 includes circuitry to accommodate the read and/or write operations.

In exemplary embodiments, the write and read operations may operate on one or more words of data, as desired. For example, in an embodiment that operates on 32-bit words, in a read operation, using the mechanisms described above (e.g., in cooperation with controller 135), destination 125 causes the reading of the 32-bit word(s) from storage circuit 115. The read or fetched data, i.e., one or more 32-bit words, are communicated to source 105.

Conversely, in a write operation, source 105 may provide one or more 32-bit words to destination 125, for ultimate storage in storage circuit 115. Using the mechanisms described above (e.g., in cooperation with controller 135), destination 125 causes the storing of the 32-bit word(s) in storage circuit 115.

In some operations, the data are read from destination 125, modified, and then stored in destination 125, i.e., a read-modify-write operation. In such operations, the data are read from destination 125, as described above. The data are then modified, for example, by source 105 or another circuit (not shown). The modification may change or modify one or more bits of one or more words of data.

The modified or new data are then written to destination 125 using a write operation, as described above. The write operation may occur on a word-by-word basis, i.e., writing one word at a time, or may write more than one word at a time, as desired.

The read-modify-write operation may cause word-aligned or word-misaligned (generally, misaligned) write operation. Specifically, in some read-modify-write operations, an entire word read from destination 125 is modified. As an example, a 32-bit word may be read from destination 125, and all 32 bits may be modified (e.g., inverted). The modified data, i.e., the modified 32-bit word, is then written to destination 125. Because all bits of the data word are modified, the operation involves a word-aligned write operation.

In some read-modify-write operations, however, the write operation may constitute a misaligned write to destination 125 and, ultimately, to storage circuit 115. Specifically, in some read-modify-write operations, part of a word read from destination 125 is modified. In order to modify part of the word, the entire word is first read from destination 125.

As an example, a 32-bit word is read from destination 125, and the lower-order 16 bits (half-word) may be modified (e.g., inverted). The remaining part of the word (in this example, the higher-order 16 bits) contains the original data, i.e., is not modified. Thus, the modification does not occur on a word boundary, because half of the word is modified, and the other half remains unchanged.

The modified data, i.e., the data word with the lower-order 16 bits in the 32-bit word modified in the example above, is then written to destination 125. Because some, but not all, bits of the data word are modified, the read-modify-write operation involves a misaligned write operation. In the above example, even though 16 bits of the 32-bit word are modified but 16 bits remain unchanged, the entire word is read, 16 bits are modified, and the modified word (i.e., the original data word with 16 bits modified) is written to destination 125 using a misaligned write operation.

Misaligned write operations can adversely impact data throughput from source 105 to destination 125. Consider for example the situation where storing a data word into destination 125 (more particularly, storage circuit 115) takes one cycle of a clock (e.g., a clock signal for destination 125 or storage circuit 115). With aligned write operations, the write operation can complete in one clock cycle.

In the case of a misaligned write, for example, as part of a read-modify-write operation, the operation takes two clock cycles. Specifically, in one clock cycle, a data word is read from storage circuit 115, and modified to reflect the desired new data to be written back to storage circuit 115. In another clock cycle, the new data or modified data are written to storage circuit 115.

Thus, overall, the read-modify-write operation takes two clock cycles when it involves misaligned write operations. In other words, a misaligned write operation causes a clock-cycle penalty, compared to a word-aligned write operation. As the number of misaligned write operations increases, the number of additional clock cycles (i.e., two cycles instead of one cycle) also increases. As a result, the data throughput between source 105 and destination 125 decreases.

Using write-back buffer 130, however, can improve or increase data throughput for misaligned write operations. More specifically, when a misaligned write occurs, for example, a misaligned write operation to a data word, the word is read from storage circuit 115 (e.g., a memory) and is stored in write-back buffer 130.

Controller 135 may facilitate or cause this operation to occur. In other words, controller 135 may retrieve or obtain or read the data word from storage circuit 115, and cause the data word to be stored in write-back buffer 130.

The data word is also modified. Specifically, as described above, once the data word is read from storage circuit 115, it may be modified, and the results (i.e., the modified data word) may then be stored in storage circuit 115 (a read-modify-write operation).

In exemplary embodiments, controller 135 may perform the modification or cause the modification to occur. The modification may be considered as a new-data generation operation, i.e., new (modified) data are generated to be written back to storage circuit 115. For example, if the existing 32-bit data word, i.e., the data word read from storage circuit 115, is hexadecimal FFFFFFFF and the modification involves inverting the lower half-word, the new data generator would produce hexadecimal FFFF0000 as the modified or new data word.

The circuitry for performing modification (e.g., a new data generator) may be implemented in a variety of ways, as desired. For example, in exemplary embodiments, the new data generator may include relatively simple logic circuitry, as person of ordinary skill in the art will understand.

Once the modification has occurred and the new data are generated, the results (modified or new data) are written to storage circuit 115 (e.g., the memory from which the original data were read). The results (modified or new data) are also written to write-back buffer 130.

In exemplary embodiments, controller 135 may coordinate or supervise the above operations, or cause them to occur. Thus, controller 135 may cause the new data word to be written to storage circuit 115 and to write-back buffer 130. Controller 135 may achieve this result in cooperation with control circuitry in storage circuit 115, write-back buffer 130, or both, as desired.

As noted above, use of write-back buffer 130 increases or improves data throughput. More specifically, once a new data word is written to write-back buffer 130, future hits (reading or writing data) from that location or address (e.g., an address for the word in a memory or, generally, storage circuit 115) entail reading the data from write-back buffer 130, modifying the data as desired, and writing the new or modified data to both write-back buffer 130 and storage circuit 115.

Thus, after the first operation on a word at a given location, subsequent writes to the same location do not incur the two clock-cycle operation described above in conventional approaches. Rather, the read operation from the buffer (e.g., in a subsequent operation that results in a hit to the same location) may occur in the same clock-cycle in which the write operation occurs.

More specifically, in exemplary embodiments, write-back buffer 130 is implemented using registers. The first time that a hit to a given location occurs, the new data are written to write-back buffer 130. With subsequent operations involving the same location, the data are read from write-back buffer 130, modified (e.g., using the new data generator), and written back to write-back buffer 130 in one clock cycle. Thus, compared to conventional approaches, i.e., reading, modifying, and writing in two clock cycles, use of write-back buffer 130 improves or increases the throughput of data flow between source 105 and destination 125.

More specifically, in conventional approaches, the data are typically read from a memory. This operation usually takes one clock cycle. The data are then modified and written back to the memory. This operation usually takes an additional clock cycle. Thus, the read-modify-write operation takes two clock cycles.

Using write-back buffer 130, however, reduces the time period to one clock cycle. Specifically, the data (e.g., a word) are read from write-back buffer 130. The data are then modified to generate new data (e.g., a new data word), and written to write-back buffer 130 and to storage circuit 115. The reading, modifying, and writing the data to write-back buffer 130 may be completed in one clock cycle. Thus, using write-back buffer 130 provides a speed or throughput advantage over conventional approaches.

As noted above, in some embodiments, storage circuit 115 may constitute a memory. In some embodiments, the memory may support error correction, for example, by using ECC. Using write-back buffer 130 also provides advantages when using memories that employ ECC, i.e., ECC memory.

In memories using ECC, typically a syndrome is calculated and stored with the data. Syndrome generation typically involves arithmetic and/or logic operations (e.g., exclusive-OR and shift operations) on the data bits to generate a set of bits, the syndrome, that allow error detection and/or error correction. (Errors may occur because of a variety of reasons, for example, because of power supply glitches, cosmic particles, etc., as person of ordinary skill in the art will understand.)

The syndrome is typically stored in the memory together with the data bits. For example, a memory may have 32-bit words, and 7-bit syndromes. Thus, storing each word uses 39 bits, i.e., 32 bits for the data, and an additional 7 bits for the syndrome. In other words, the memory is 39 bits wide.

As noted above, write-back buffer 130 may be used with misaligned write operations to ECC memory. During a read operation, the data are read together with the corresponding syndrome from a desired or given location in the ECC memory. During a modify operation, the new data generator generates the modified or new data. A syndrome generator generates the syndrome that corresponds to the new data. During the write operation, the new data and the corresponding syndrome are written to write-back buffer 130 and the memory.

During subsequent read operations to the same location, the data and the corresponding syndrome are read from write-back buffer 130. A modify operation may be performed to generate new data and corresponding syndrome bits. The new data and the corresponding syndrome may then be written to write-back buffer 130 and to the ECC memory. This operation take one clock cycle. More specifically, the read operation, the generation of the new data and the corresponding syndrome, and writing the results to write-back buffer 130 may be performed in one clock cycle.

FIG. 2 depicts a process-flow diagram for a method of storing information using a write-back buffer according to an exemplary embodiment. The process flow may be performed by controller 135 (see FIG. 1) or by other mechanisms, as desired.

Referring to FIG. 2, at 205, a command is received. The command may be received, for example, from source 105. The command may relate, among other things, to operations that relate to destination 125 generally, or storage circuit 115, more particularly.

At 210, the command is interpreted. Interpretation of the command in part involves a determination whether it includes instruction(s) for operation(s) involving destination 125 or storage circuit 115. If so, the command may involve read and/or write operations.

In the case of a read operation, at 215, the word is read from destination 125 (e.g., from storage circuit 115), and is stored in write-back buffer 130. The originator of the command, e.g., source 105, may then receive the requested data.

In the case of a write operation, e.g., as part of a read-modify-write operation, at 220 new data are generated. In some cases, the source of the data may directly provide the new data. In such a situation, no new data need be generated, as the new data are provided from the source, e.g., source 105.

At 225, if an ECC memory is used, a syndrome corresponding to the new data is generated. At 230, the new data are written to write-back buffer 130 and to destination 125 (e.g., storage circuit 115). In the case of an ECC memory, the syndrome corresponding to the new data is also written to write-back buffer 130 and to destination 125 (e.g., storage circuit 115).

In some embodiments, source 105 and destination 125 may reside in separate circuit partitions. For example, in some embodiments, source 105 and destination 125 may each reside in an integrated circuit (IC). As another example, in some embodiments, source 105 and destination 125 may reside within a multi-chip module (MCM). In such an arrangement, source 105 and destination 125 may each constitutes a semiconductor die.

A variety of circuit arrangements are possible and contemplated that incorporate write-back buffer 130. In various embodiments, write-back buffer 130 may be located in a choice of several locations. More specifically, in exemplary embodiments, write-back buffer 130 may be included in destination 125 (as shown in FIG. 1), in source 105, or separately from source 105 and destination 125, as desired.

FIG. 3 depicts a circuit arrangement 150 for storing information using a write-back buffer according to another exemplary embodiment. Circuit arrangement 150 includes write-back buffer 130, and operates similarly to circuit arrangement 100 in FIG. 1.

In the embodiment shown in FIG. 3, however, controller 135 and write-back buffer 130 are included within a circuit partition 140. Source 105 and destination 125 are shown as included in separate circuit partitions, but they may reside within the same circuit partition, as desired.

In some embodiments, circuit partition 140 may constitute an IC. In such arrangements, source 105 and destination 125 may each reside in a separate IC or may be included in one IC. In some embodiments, circuit partition 140 may be included in an MCM (e.g., as a semiconductor die). The MCM may include source 105 and/or destination 125, as desired.

FIG. 4 shows a circuit arrangement 160 for storing information using a write-back buffer according to another exemplary embodiment. Circuit arrangement 160 includes write-back buffer 130, and operates similarly to circuit arrangement 100 in FIG. 1.

In the embodiment shown in FIG. 4, however, controller 135 and write-back buffer 130 are included within source 105. Source 105 resides in circuit partition 165. Destination 125, including storage circuit 115, resides in circuit partition 170.

In some embodiments, the circuit partition 165 and circuit partition 170 may constitute ICs. In such arrangements, circuit partition 165 and circuit partition 170 may each reside in a separate IC. In some embodiments, circuit partition 165 and circuit partition 170 may be included in an MCM (e.g., as two semiconductor die).

One aspect of the disclosure relates to memory circuits that include write-back buffers. In some embodiments, such memory circuits may be included in with other circuitry (e.g., as a subsystem or block), for example, as part of an IC. In some embodiments, such memory circuits may be provided as a separate circuit partition (e.g., as semiconductor die, IC, etc.).

FIG. 5 illustrates a circuit arrangement for a memory circuit 300 that uses a write-back buffer 130 according to an exemplary embodiment. Memory circuit 300 includes controller 135, write-back buffer 130, and memory array 115.

Controller 135 includes control circuitry 310, syndrome generator 315, and new data generator 320. New data generator 320 modifies one or more units or chunks of data, for example, word(s), to generate new or modified data, as described above in detail.

Syndrome generator 315 generates a syndrome that corresponds to a given data unit (e.g., word), as described above in detail. For example, syndrome generator 315 may generate a syndrome that corresponds to a new data word generated by new data generator 320. As described above in detail, in exemplary embodiments, the new data and the corresponding syndrome are stored in write-back buffer 130 and memory array 115.

Write-back buffer 130 operates under the supervision of controller 135. Write-back buffer 130 provides improved or increased data throughput and/or increased data communication speed, as described above in detail.

In exemplary embodiments, memory array 115 may include a variety of memory circuitry, as desired. Examples include volatile memory and non-volatile memory, as described above in detail.

Control circuitry 310 supervises or controls the respective operations of write-back buffer 130, syndrome generator 315, and new data generator 320. Control circuitry 310 also uses link 325 to communicate with a circuit external to memory circuit 300. In exemplary embodiments, link 320 may constitute a coupling mechanism, such as a bus, a set of conductors or semiconductors for communicating information, such as data, commands, status information, and the like.

More specifically, control circuitry 310 may receive one or more commands via link 325, as described above in detail in connection with FIG. 2. Referring to FIG. 5, control circuitry 310 may interpret and execute the command(s) in order to cause to occur one or more operations involving memory array 115, e.g., read operations, write operations, and read-modify-write operations.

In some embodiments, memory circuit 300 may communicate with an external processor (not shown) via link 325. In such configurations, memory circuit 300 may receive commands and/or data from the external processor, and in response perform one or more operations, e.g., read operations, write operations, and read-modify-write operations, as described above in detail.

Figure 6:
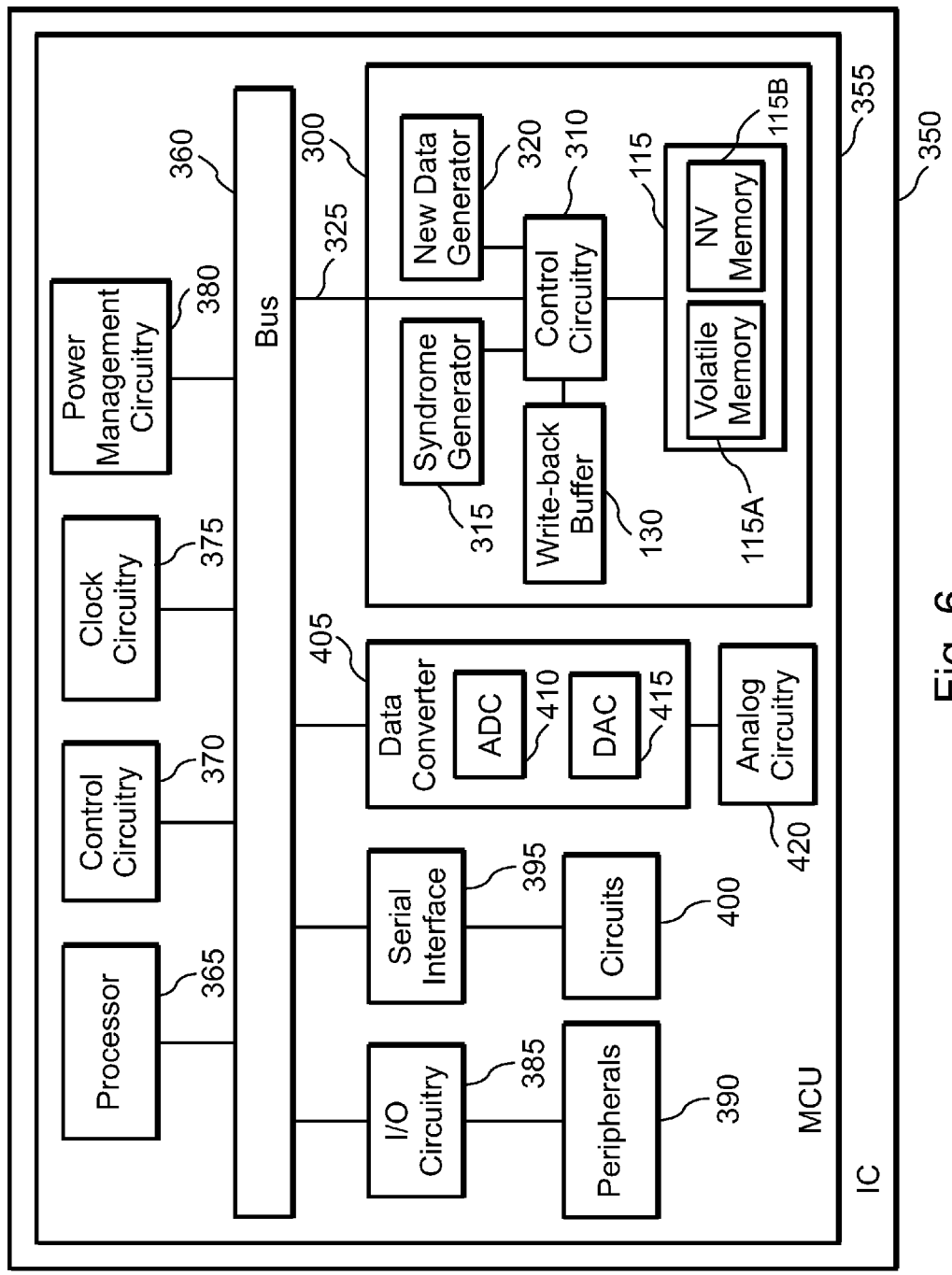
FIG. 6 depicts a circuit arrangement of a microcontroller unit (MCU) that includes a memory circuit with a write-back buffer according to an exemplary embodiment.

In some embodiments, memory circuit 300 may be included together with other circuitry, such as a processor, MCU, etc. FIG. 6 depicts a circuit arrangement that includes an MCU 355 that includes a memory circuit 300 with a write-back buffer 130 according to an exemplary embodiment.

MCU 355 includes a number of blocks (e.g., processor 365, data converter 405, I/O circuitry 385, etc.) that communicate with memory circuit 300 using a link 360. In exemplary embodiments, link 320 may constitute a coupling mechanism, such as a bus, a set of conductors or semiconductors for communicating information, such as data, commands, status information, and the like.

MCU 355 may include link 360 coupled to one or more processor 365, clock circuitry 375, and power management circuitry 380. Clock circuitry 375 may generate one or more clock signals that facilitate or control the timing of operations of one or more blocks in MCU 355. Clock circuitry 375 may also control the timing of operations that use link 360.

In some embodiments, power management circuitry 380 may reduce an apparatus's (e.g., MCU 355) clock speed, turn off the clock, reduce power, turn off power, or any combination of the foregoing with respect to part of a circuit or all components of a circuit. Further, power management circuit 380 may turn on a clock, increase a clock rate, turn on power, increase power, or any combination of the foregoing in response to a transition from an inactive state to an active state (such as when processor(s) 365 make a transition from a low-power or idle or sleep state to a normal operating state).

Link 360 may couple to one or more circuits 400 through serial interface 395. Through serial interface 395, one or more circuits coupled to link 360 may communicate with circuits 400. Circuits 400 may communicate using one or more serial protocols, e.g., SMBUS, I²C, SPI, and the like, as person of ordinary skill in the art will understand.

Link 360 may couple to one or more peripherals 390 through I/O circuitry 385. Through I/O circuitry 385, one or more peripherals 390 may couple to link 360 and may therefore communicate with other blocks coupled to link 360, e.g., processor(s) 365, memory circuit 300, etc.

In exemplary embodiments, peripherals 390 may include a variety of circuitry, blocks, and the like. Examples include I/O devices (keypads, keyboards, speakers, display devices, storage devices, timers, etc.). Note that in some embodiments, some peripherals 390 may be external to MCU 355. Examples include keypads, speakers, and the like.

In some embodiments, with respect to some peripherals, I/O circuitry 385 may be bypassed. In such embodiments, some peripherals 390 may couple to and communicate with link 360 without using I/O circuitry 385. Note that in some embodiments, such peripherals may be external to MCU 355, as described above.

Link 360 may couple to analog circuitry 420 via data converter 405. Data converter 405 may include one or more ADCs and/or one or more DACs. The ADC(s) receive analog signal(s) from analog circuitry 420, and convert the analog signal(s) to a digital format, which they communicate to one or more blocks coupled to link 360.

Conversely, the DAC(s) receive one or more digital signals from one or more blocks coupled to link 360, and convert the digital signal(s) to an analog format. The analog signal(s) may be provided to circuitry within (e.g., analog circuitry 420) or circuitry external to MCU 355, as desired.

Analog circuitry 420 may include a wide variety of circuitry that provides and/or receives analog signals. Examples include sensors, transducers, and the like, as person of ordinary skill in the art will understand.

Control circuitry 370 couples to link 360. Thus, control circuitry 370 may communicate with and/or control the operation of various blocks coupled to link 360. In addition or as an alternative, control circuitry 370 may facilitate communication or cooperation between various blocks coupled to link 360.

In some embodiments, control circuitry 370 may initiate or respond to a reset operation. The reset operation may cause a reset of one or more blocks coupled to link 360, of MCU 355, etc., as person of ordinary skill in the art will understand.

In exemplary embodiments, control circuitry 370 may include a variety of types and blocks of circuitry. In some embodiments, control circuitry 370 may include logic circuitry, finite-state machines (FSMs), or other circuitry to perform a variety of operations, as described above.

As noted, memory circuit 300 couples to link 360. Consequently, memory circuit 300 may communicate with one or more blocks coupled to link 360, such as processor(s) 365, control circuitry 370, I/O circuitry 385, etc. In the embodiment shown, memory circuit 300 includes control circuitry 310, syndrome generator 315, new data generator 320, memory array 115, and write-back buffer 130. The various blocks of circuitry in memory circuit 300 may operate as described above in detail.

As noted above, memory array 115 may include a variety of memory circuits or blocks. In the embodiment shown, memory array 115 includes volatile memory 115A and non-volatile (NV) memory 115B. In some embodiments, memory array 115 may include voltage memory 115A. In some embodiments, memory array 115 may include NV memory 115B.

As noted above, use of write-back buffer 130 improves or increases the throughput of memory circuit 300. Thus, use of write-back buffer 130 improves communication between memory circuit 300 and one or more blocks coupled to link 360. Note that in the embodiment shown write-back buffer 130 is included as part of memory circuit 300. In other embodiments, write-back buffer 130 may be included in another block in MCU 355, or may couple to link 360 as another block.

Figure 7:
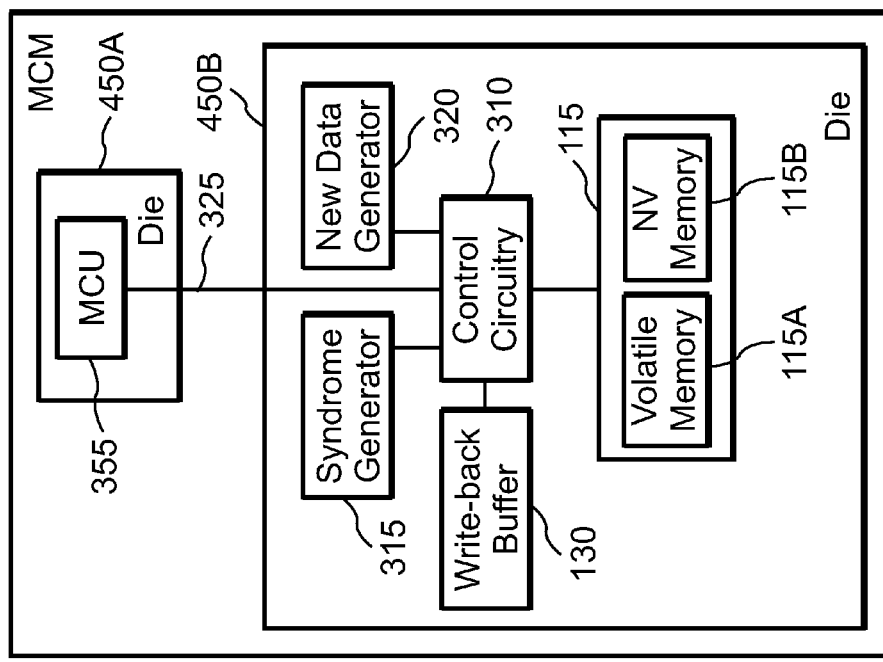
FIG. 7 illustrates a circuit arrangement of an MCU and a memory with a write-back buffer according to another exemplary embodiment.

A variety of other configurations and arrangements of MCUs and memory circuits are possible and contemplated. FIG. 7 illustrates a circuit arrangement of an MCU 355 and a memory circuit 300 that includes a write-back buffer 130 according to another exemplary embodiment. In the embodiment shown in FIG. 7, MCU 355 is included in IC 350. Conversely, memory circuit 300 is included in IC 430.

MCU 355 communicates with memory circuit 300 via link 325, as described above. More specifically, link 325 allows MCU 355 (e.g., one or more blocks or circuits in MCU 355) to communicate with memory circuit 300. As noted, memory circuit 300 includes write-back buffer 130, which improves or increases data throughput between MCU 355 and memory circuit 300, as described above in detail.

Figure 8:
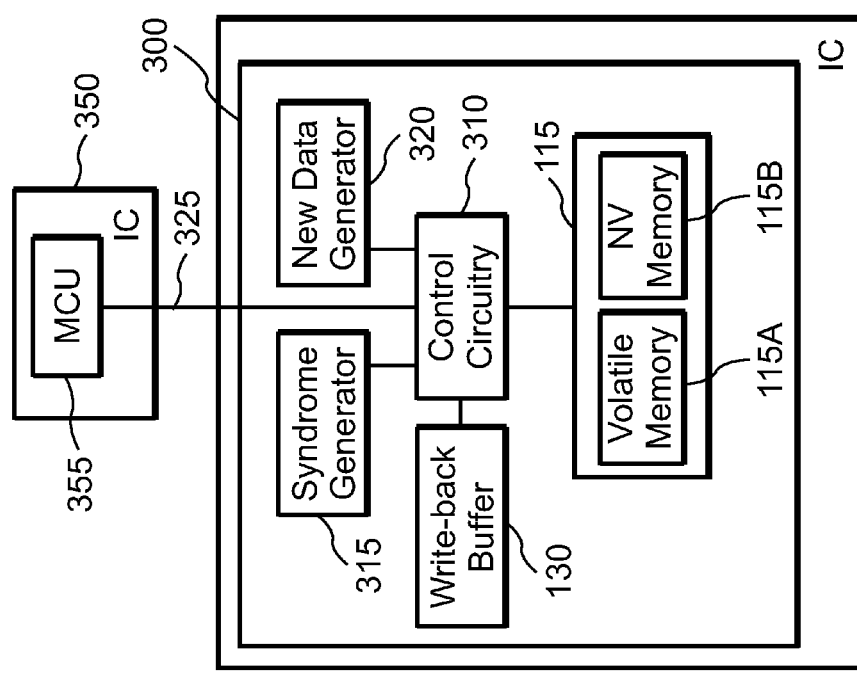
FIG. 8 shows a circuit arrangement of an MCU and a memory with a write-back buffer according to another exemplary embodiment.

FIG. 8 shows illustrates a circuit arrangement of an MCU 355 and a memory circuit 300 that includes a write-back buffer 130 according to another exemplary embodiment. In the embodiment shown in FIG. 7, MCU 355 is included in die 450A. Conversely, memory circuit 300 is included in die 450B. Die 450A and die 450B are included in MCM 455.

Similar to the embodiment of FIG. 7, MCU 355 in FIG. 8 communicates with memory circuit 300 via link 325, as described above. More specifically, link 325 allows MCU 355

(e.g., one or more blocks or circuits in MCU 355) to communicate with memory circuit 300. As noted, memory circuit 300 includes write-back buffer 130, which improves or increases data throughput between MCU 355 and memory circuit 300, as described above in detail.

As persons of ordinary skill in the art understand, one may apply the disclosed concepts effectively to various electronic devices and apparatus. Examples described in this document constitute merely illustrative applications, and are not intended to limit the application of the disclosed concepts to other types of devices or apparatus by making appropriate modifications. Those modifications fall within the knowledge and level of skill of persons of ordinary skill in the art. For example, rather than MCUs, write-back buffers may be used in or together with microprocessors, programmable logic circuits, and the like, as desired.

Referring to the figures, persons of ordinary skill in the art will note that the various blocks shown might depict mainly the conceptual functions and signal flow. The actual circuit implementation might or might not contain separately identifiable hardware for the various functional blocks and might or might not use the particular circuitry shown. For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation. Other modifications and alternative embodiments in addition to those described here will be apparent to persons of ordinary skill in the art. Accordingly, this description teaches those skilled in the art the manner of carrying out the disclosed concepts, and is to be construed as illustrative only. Where applicable, the figures might or might not be drawn to scale, as persons of ordinary skill in the art will understand.

The forms and embodiments shown and described should be taken as illustrative embodiments. Persons skilled in the art may make various changes in the shape, size and arrangement of parts without departing from the scope of the disclosed concepts in this document. For example, persons skilled in the art may substitute equivalent elements for the elements illustrated and described here. Moreover, persons skilled in the art may use certain features of the disclosed concepts independently of the use of other features, without departing from the scope of the disclosed concepts.

The invention claimed is:

1. An apparatus comprising:
   a source to communicate data;
   a storage circuit to store data communicated by the source; and
   a write-back buffer to store data communicated by the source in a misaligned write operation in order to improve throughput between the source and the storage circuit.

2. The apparatus according to claim 1, wherein the misaligned write operation occurs as part of a read-modify-write operation.

3. The apparatus according to claim 1, wherein the storage circuit comprises a memory circuit.

4. The apparatus according to claim 3, wherein the memory circuit comprises volatile memory circuitry and/or non-volatile memory circuitry.

5. The apparatus according to claim 3, wherein the memory circuit comprises error-correction code (ECC).

6. The apparatus according to claim 1, wherein the storage circuit resides in an integrated circuit (IC).

7. The apparatus according to claim 6, wherein the write-back buffer resides in the IC.

8. The apparatus according to claim 7, wherein the IC comprises a microcontroller unit (MCU).

9. The apparatus according to claim 1, wherein the write-back buffer comprises a register.

10. The apparatus according to claim 2, wherein the read-modify-write operation comprises writing data to both the storage circuit and the write-back buffer.

11. An apparatus comprising:
    a memory circuit comprising:
      a controller coupled via a link to receive data from a source external to the memory circuit and to provide data to the source external to the memory circuit;
      a storage circuit to store data in a write operation and to provide data in a read operation; and
      a write-back buffer coupled to store data in the write operation and to provide data in the read operation so as to improve misaligned write data throughput between the memory circuit and the source external to the memory circuit.

12. The apparatus according to claim 11, wherein the memory circuit resides in an integrated circuit (IC).

13. The apparatus according to claim 11, wherein the source comprises a processor or microcontroller unit (MCU).

14. The apparatus according to claim 11, wherein the memory circuit uses error-correction code (ECC).

15. The apparatus according to claim 14, wherein the memory circuit further comprises a new data generator to modify data to generate new data to be written to the storage circuit; and a syndrome generator to generate a syndrome corresponding to the new data.

16. The apparatus according to claim 15, wherein in a misaligned write operation the controller causes the new data and the corresponding syndrome to be written to the storage circuit and to the write-back buffer in one clock cycle.

17. A method of writing misaligned data, the method comprising:
    receiving data from a source during a misaligned write operation;
    storing the data received from the source in a storage circuit;
    storing the data received from the source in a write-back buffer to improve throughput between the source and the storage circuit.

18. The method according to claim 17, further comprising modifying the data received from the source before storing the data in the storage circuit and in the write-back buffer.

19. The method according to claim 17, wherein the misaligned write operation occurs as part of a read-modify-write operation.

20. The method according to claim 17, wherein storing data received from the source in the storage circuit further comprises storing the data in a memory during a clock cycle; and wherein storing data received from the source in the write-back buffer further comprises storing the data in a register during the clock cycle.

* * * * *